United States Patent
Christensen

(10) Patent No.: US 7,163,586 B2
(45) Date of Patent: Jan. 16, 2007

(54) VAPOR DEPOSITION APPARATUS

(75) Inventor: Dennis R. Christensen, Carmel, IN (US)

(73) Assignee: Specialty Coating Systems, Inc., Indianapolis, IN (US)

( * ) Notice: Subject to any disclaimer, the term of this patent is extended or adjusted under 35 U.S.C. 154(b) by 335 days.

(21) Appl. No.: 10/706,239

(22) Filed: Nov. 12, 2003

(65) Prior Publication Data

US 2005/0098114 A1     May 12, 2005

(51) Int. Cl.
C23C 16/00     (2006.01)
(52) U.S. Cl. .................................... 118/719; 414/935
(58) Field of Classification Search ................ 118/719
See application file for complete search history.

(56) References Cited

U.S. PATENT DOCUMENTS

| | | |
|---|---|---|
| 4,163,828 A | 8/1979 | Mahoney |
| 4,276,855 A | 7/1981 | Seddon et al. |
| 4,667,579 A | 5/1987 | Daw |
| 4,817,557 A | 4/1989 | Diem et al. |
| 4,945,856 A | 8/1990 | Stewart |
| 5,201,956 A | 4/1993 | Humphrey et al. |
| 5,264,039 A | 11/1993 | Gobush et al. |
| 5,266,349 A | 11/1993 | Bok |
| 5,268,033 A | 12/1993 | Stewart |
| 5,272,007 A | 12/1993 | Jenkinson et al. |
| 5,312,489 A | 5/1994 | Olson |
| 5,364,225 A * | 11/1994 | Hecht et al. ............... 414/805 |
| 5,424,097 A | 6/1995 | Olson et al. |
| 5,534,068 A | 7/1996 | Beach et al. |
| 5,536,317 A | 7/1996 | Crain et al. |
| 5,536,319 A | 7/1996 | Wary et al. |
| 5,536,321 A | 7/1996 | Olsen et al. |
| 5,536,322 A | 7/1996 | Wary et al. |
| 5,538,758 A | 7/1996 | Beach et al. |
| 5,556,473 A | 9/1996 | Olson et al. |
| 5,641,358 A | 6/1997 | Stewart |
| 5,669,971 A | 9/1997 | Bok et al. |
| 5,709,753 A | 1/1998 | Olson et al. |
| 5,855,726 A * | 1/1999 | Soraoka et al. ......... 156/345.32 |
| 5,908,506 A | 6/1999 | Olson et al. |
| 6,086,952 A | 7/2000 | Lang et al. |
| 6,326,056 B1 | 12/2001 | Yira et al. |

(Continued)

FOREIGN PATENT DOCUMENTS

EP     1 119 022     7/2001

OTHER PUBLICATIONS

European Search Report, Feb. 25, 2005, 4 pages.

*Primary Examiner*—Karla Moore
(74) *Attorney, Agent, or Firm*—Senniger Powers

(57) ABSTRACT

A vapor deposition apparatus for coating an item has a cleanroom side that is accessible from inside a cleanroom and a service side that is not accessible from inside the cleanroom. The apparatus has a vaporizer for vaporizing solid coating material and a pyrolysis furnace for heating the vaporized coating material to form a pyrolized gaseous coating material. A deposition enclosure defines a deposition chamber for receiving an item to be coated. The deposition enclosure has an inlet for flow of pyrolized gaseous coating material into the deposition chamber, an outlet for flow of pyrolized gaseous coating material from the deposition chamber, an access door for accessing the deposition chamber from the cleanroom side of the apparatus, and a service door for accessing the deposition chamber from the service side of the apparatus.

25 Claims, 16 Drawing Sheets

U.S. PATENT DOCUMENTS

| | | |
|---|---|---|
| 6,368,208 B1 | 4/2002 | Minoshima |
| 6,375,745 B1 | 4/2002 | Yira et al. |

| | | | |
|---|---|---|---|
| 2002/0102400 A1 | 8/2002 | Gorokhovsky et al. | |
| 2003/0159277 A1* | 8/2003 | Harris et al. | 29/829 |

* cited by examiner

VAPOR DEPOSITION APPARATUS

BACKGROUND OF THE INVENTION

This invention relates generally to a vapor deposition apparatus and more particularly to a vapor deposition apparatus having a deposition enclosure accessible from within a cleanroom.

Coating materials are often used as protective barriers on circuit boards, integrated circuit devices, medical devices and the like to protect the devices from moisture, contaminants, corrosives and chemicals. One exemplary coating material is parylene, which is the generic term for the inert nonconductive polymers in the family of unsubstituted and substituted poly-p-xylylene. Parylene has three primary variations typically referred to as parylene C, parylene N and parylene D. Each of these three variations may be deposited on an item as the chemical is converted under vacuum and heat from a powdered dimer form to a clear polymer film. Unlike liquid coatings, parylene is deposited in equal thickness on all surfaces, including around sharp edges and in deep crevices of the item being coated. Reference may be made to U.S. Pat. No. 4,163,828, incorporated by reference herein for all purposes, for additional information regarding the chemical composition of parylene coatings and the parylene deposition process.

Parylene is applied to an item to be coated at room temperature with deposition equipment that controls both the coating rate and the coating thickness. Parylene deposition takes place at the molecular level as a powdered chemical is vaporized under vacuum and heat to form a dimeric gas. The dimeric gas is pyrolized to cleave the dimer to its monomeric form. The monomer gas enters a room temperature deposition chamber where it simultaneously adsorbs and polymerizes on the item. Typical parylene deposition equipment includes a vaporizer where the dimer is vaporized by heating, a pyrolysis furnace where the dimeric gas is pyrolized by further heating, a deposition enclosure where the coating is deposited on the item to be coated, a cold trap to filter excess parylene passing through the deposition chamber, and a vacuum pump downstream of the cold trap that creates vacuum pressure throughout the system. Reference may be made to U.S. Pat. Nos. 4,163,828, 5,264,039 and 5,908,506, incorporated by reference herein for all purposes, for additional background information regarding parylene deposition equipment.

Medical devices, integrated circuit devices, and other devices that are frequently coated with parylene may be manufactured, or otherwise processed, in a cleanroom to prevent contamination of the devices by dust, chemical substances in the air, or other impurities. Preventing contamination of these devices improves the performance characteristics of the final products utilizing these devices and eliminates failures associated with such contamination. Cleanrooms are rooms in which the concentration of airborne particles is controlled to specified limits. Cleanrooms typically use high flow capacity ventilation systems with high efficiency filters that frequently recycle the total volume of air within the cleanroom to maintain the desired level of concentration of airborne particles. Cleanrooms are expensive to operate and difficult to maintain substantially free of airborne contaminates. Reference may be made to U.S. Pat. No. 6,368,208, incorporated by reference herein for all purposes, for additional information regarding cleanrooms and cleanroom ventilation.

Existing high volume vapor deposition machines are not well suited for operation in a cleanroom environment. Contaminates in the form of the solid parylene dimer or other airborne contaminants are generated by operation and maintenance of such machines. These contaminates contribute to contamination of the cleanroom and prohibit effective operation of such machines in a cleanroom. Further, during normal operation of the vapor deposition machine, the deposition chamber and the cold trap must be periodically cleaned to remove excess parylene that builds up on the internal surfaces of these items. This routine cleaning cannot be done in the cleanroom without contaminating the air quality in the cleanroom. Further, portable deposition machines that can be operated from within the cleanroom and removed from the cleanroom for cleaning have a reduced capacity which limits their use to small scale production runs, thus increasing the cost of the items being manufactured. Also, a portable deposition machine is not ideal for operating in a cleanroom because airborne contaminants generated when solid coating material is loaded into the machine may degrade the air quality in the cleanroom. Therefore, there is a need for a vapor deposition machine that allows coating of an item manufactured or otherwise processed in a cleanroom without jeopardizing the air quality of the cleanroom.

SUMMARY OF THE INVENTION

Among the several objects of this invention may be noted the provision of a vapor deposition apparatus that allows loading of an item to be coated from within a cleanroom; the provision of such an apparatus that allows routine maintenance from outside a cleanroom; the provision of such an apparatus that does not contaminate a cleanroom; the provision of such an apparatus which reduces manufacturing costs of coating an item within a cleanroom; the provision of such an apparatus that may be positioned outside of a cleanroom but still allows isolated access from inside the cleanroom; and the provision of such an apparatus that allows operator control from inside a cleanroom.

In general, a vapor deposition apparatus of the present invention for coating an item has a cleanroom side that is accessible from inside a cleanroom and a service side that is not accessible from inside the cleanroom. The apparatus has a vaporizer for vaporizing solid coating material and a pyrolysis furnace for heating the vaporized coating material to form a pyrolized gaseous coating material. A deposition enclosure defines a deposition chamber for receiving an item to be coated. The deposition enclosure has an inlet for flow of pyrolized gaseous coating material into the deposition chamber, an outlet for flow of pyrolized gaseous coating material from the deposition chamber, an access door for accessing the deposition chamber from the cleanroom side of the apparatus, and a service door for accessing the deposition chamber from the service side of the apparatus.

In another aspect of the invention, a deposition enclosure for use in a vapor deposition apparatus having a cleanroom side and a service side has a structure defining a deposition chamber for receiving an item to be coated. The enclosure has an inlet for flow of coating material into the deposition chamber and an outlet for flow of coating material out of the deposition chamber. The enclosure has at least two doors attached to the structure to allow access to the deposition chamber. At least one of the doors allows access to the deposition chamber from the cleanroom side of the apparatus for placement of an item to be coated in the deposition chamber and for removal of a coated item from the deposition chamber.

Another aspect of the invention is directed to a process for coating an item in a cleanroom by vapor deposition. The process comprises providing a vapor deposition apparatus having a cleanroom side accessible from a cleanroom and a service side accessible from outside the cleanroom. The item is loaded into the vapor deposition apparatus by accessing the cleanroom side of the apparatus from inside the cleanroom. Solid coating material is loaded into the vapor deposition apparatus by accessing the service side of the apparatus from outside the cleanroom. The vapor deposition apparatus is operated to heat the solid material to form a gaseous coating material and to deposit solid coating material on the item to form a coating on the item. The item is removed from the vapor deposition apparatus by accessing the cleanroom side of the apparatus from inside the cleanroom.

In yet another aspect of the invention, a vapor deposition apparatus of the present invention for coating an item is positioned outside of a cleanroom and is accessible from inside the cleanroom through an opening in a cleanroom wall. The apparatus has a vaporizer for vaporizing solid coating material and a pyrolysis furnace for heating the vaporized coating material to form a pyrolized gaseous coating material. A deposition enclosure defines a deposition chamber for receiving an item to be coated. The deposition enclosure has an inlet for flow of pyrolized gaseous coating material into the deposition chamber, an outlet for flow of pyrolized gaseous coating material from the deposition chamber, and at least two doors for accessing the deposition chamber. The apparatus has a shroud at least partially surrounding one of the at least two doors to allow isolated access to the deposition chamber from inside the cleanroom.

BRIEF DESCRIPTION OF THE DRAWINGS

Corresponding parts are designated by corresponding reference numbers throughout the drawings.

DESCRIPTION OF PREFERRED EMBODIMENTS

Figure 1:
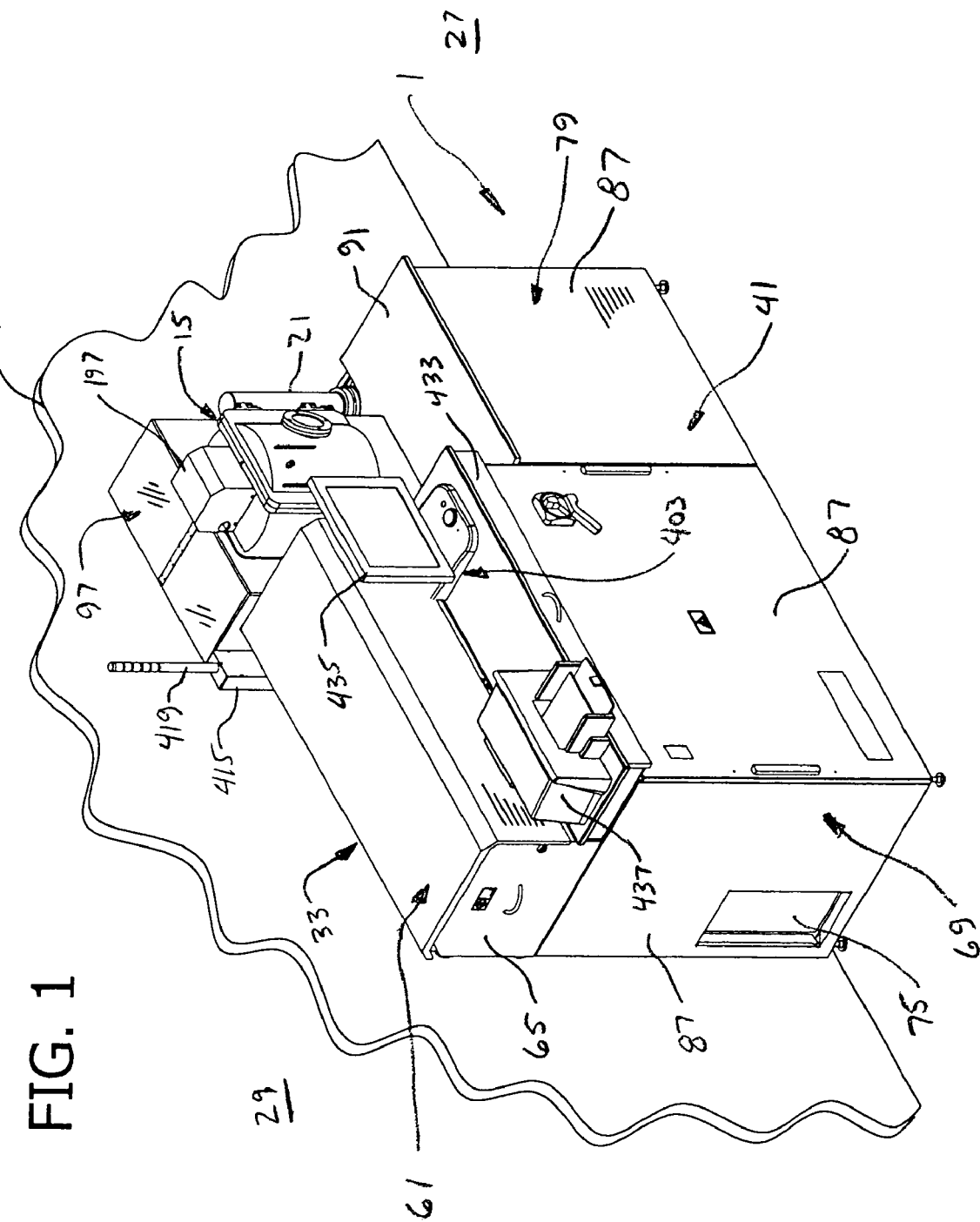
FIG. 1 is a front perspective of a vapor deposition apparatus of the present invention located adjacent a cleanroom.
Figure 2:
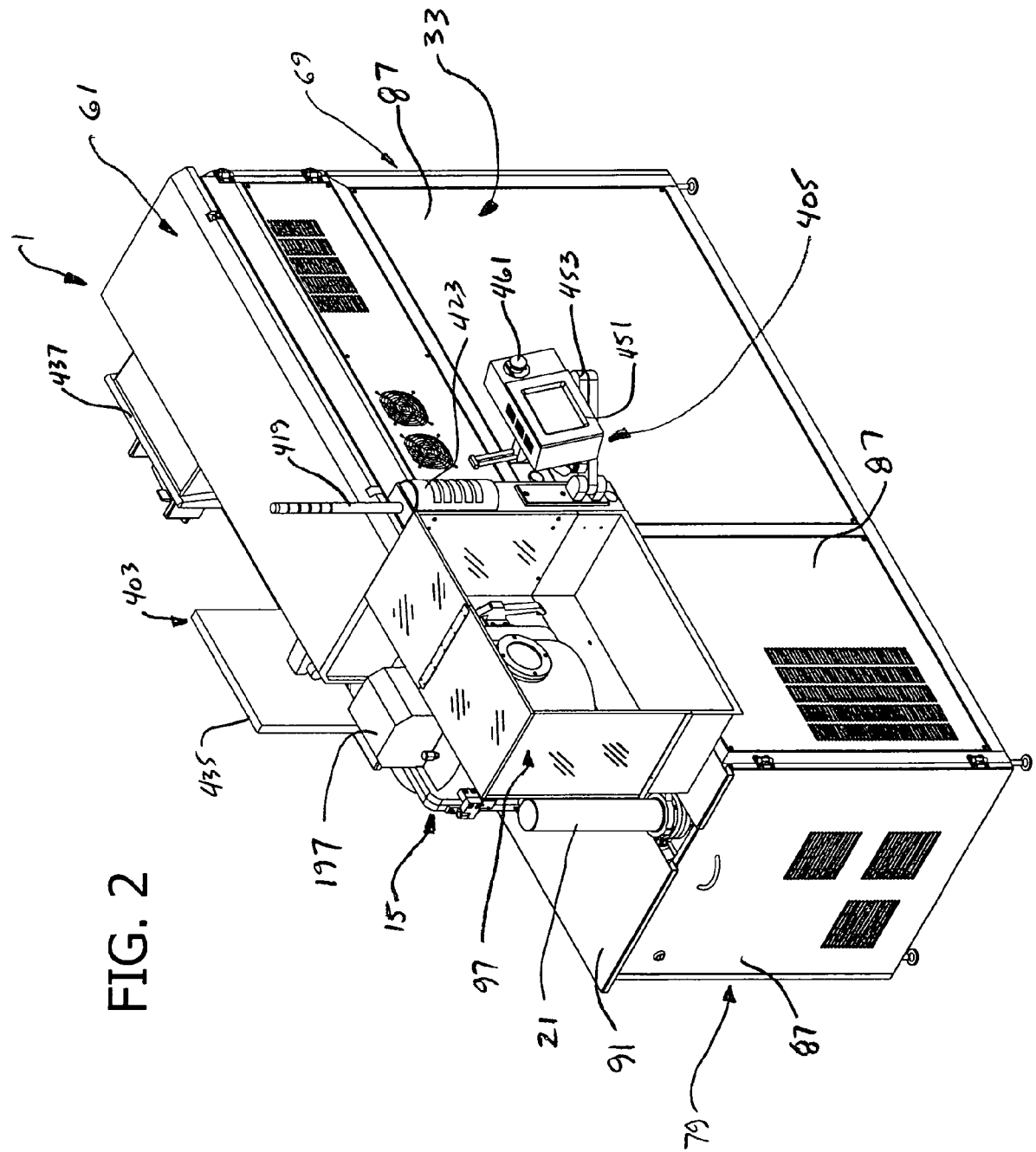
FIG. 2 is a rear perspective of the vapor deposition apparatus.
Figure 3:
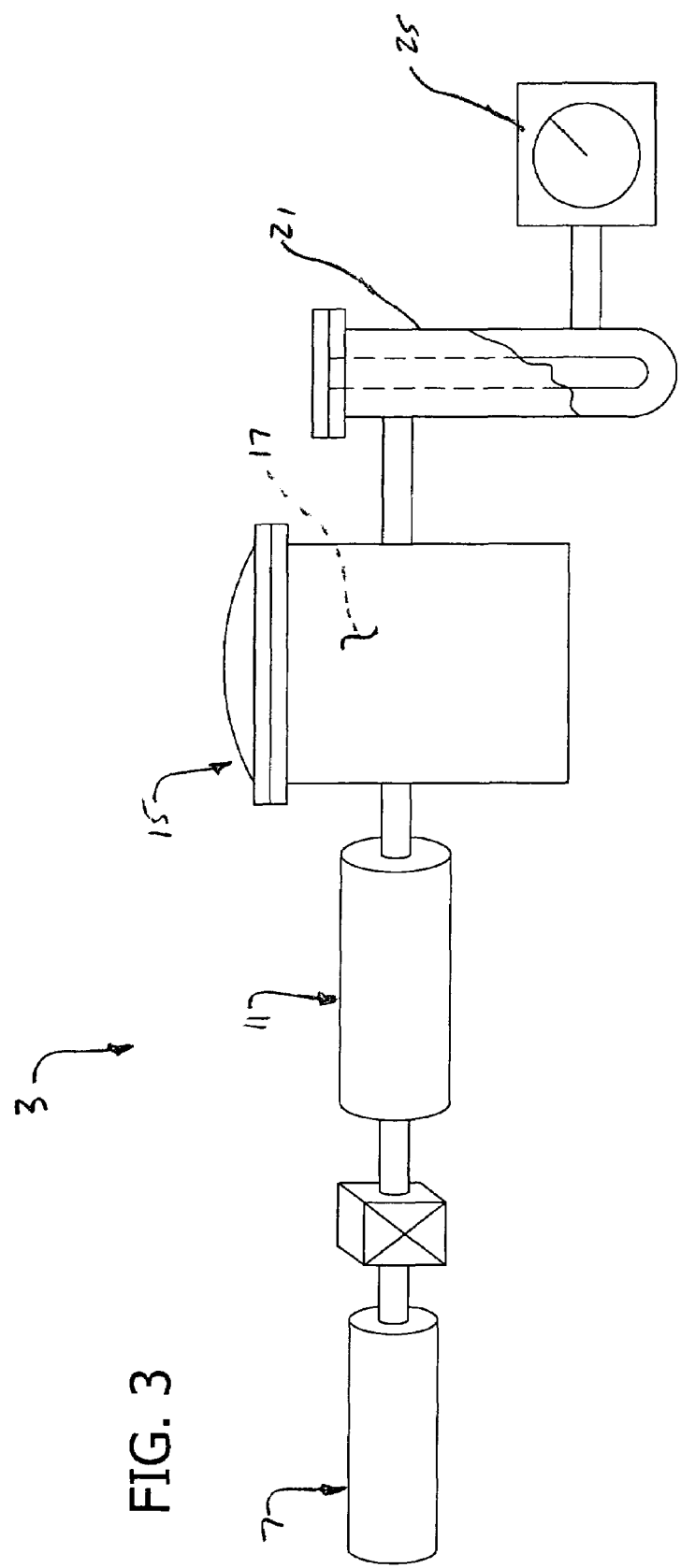
FIG. 3 is a schematic of a various components used in the vapor deposition apparatus of the present invention.

Referring to FIGS. 1–3, a vapor deposition apparatus of the present invention is designated in its entirety the reference numeral 1. The apparatus comprises a parylene deposition system, generally indicated 3, for coating an item (not shown) with a protective coating of parylene. The system 3 comprises a vaporizer, generally indicated 7, for vaporizing solid coating material, a pyrolysis furnace, generally indicated 11, for heating the vaporized coating material to form a pyrolyzed gaseous coating material, a deposition enclosure, generally indicated 15, defining a deposition chamber 17 for receiving an item to be coated, a cold trap or filter 21 downstream from the deposition enclosure, and a vacuum pump 25 downstream of the cold trap to provide vacuum pressure to the system. The parylene deposition system 3 coats an item in the deposition chamber 17 with a parylene coating that is a thin transparent polymer coating that can be used to protect electronic circuits, electrical circuit components (e.g., microelectromechanical system (MEMS) devices, microchips, or other integrated circuit devices), optical devices (e.g., lenses or mirrors), medical devices, and other implantable devices. The present invention 1 is particularly useful in applying coatings to such items that are manufactured or otherwise processed from within a cleanroom 29.

Figure 4:
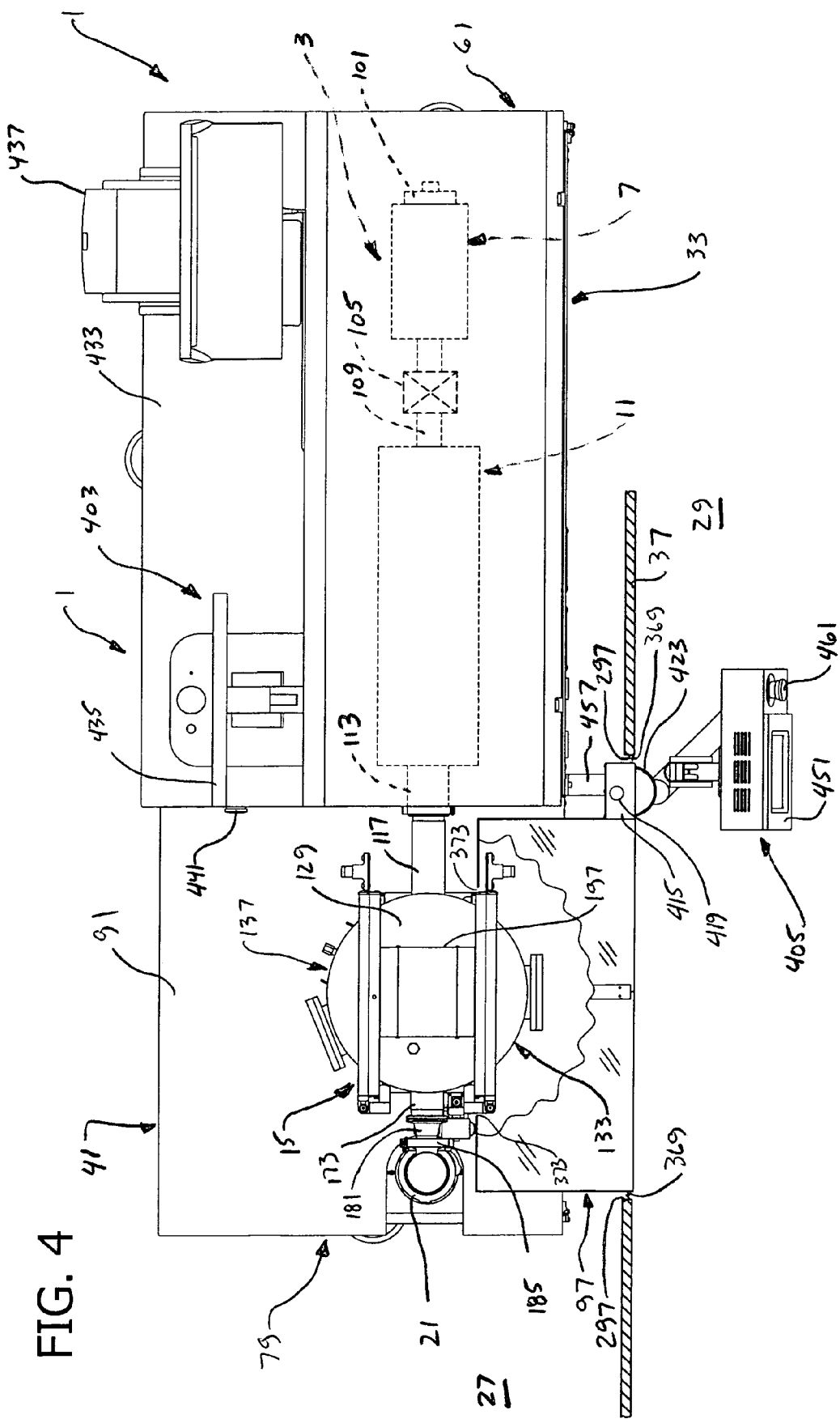
FIG. 4 is top view of the vapor deposition apparatus with a shroud partially broken away to show details.

As shown in FIGS. 1 and 4, the vapor deposition apparatus 1 is generally positioned in a service room 27 outside and adjacent the cleanroom 29 where the items to be coated are manufactured or processed. The apparatus 1 has a cleanroom side, generally indicated 33, located at the back of the apparatus and generally adjacent a wall 37 of the cleanroom 29 and a service side, generally indicated 41, at the front and sides of the apparatus generally located away from the wall of the cleanroom. Alternatively, the wall 37 may divide an enclosed space into separate cleanroom zones with the room 27 being a first zone having a cleanroom rating corresponding with a lower air quality than the second zone 29 isolated by the wall 37. For example, the first zone 27 may have a Class 10,000 cleanroom rating and the second zone 29 isolated from the apparatus 1 may have a Class 10 cleanroom rating, with the class designation of each zone indicating the number of 0.5 µm size particles per cubic foot of volume in the zone. Reference may be made to U.S. Pat. No. 4,667,579, incorporated by reference herein for all purposes, for additional information regarding cleanrooms and cleanroom ratings.

In the illustrated embodiment, the apparatus 1 comprises an upper cabinet, generally indicated 61, that houses the vaporizer 7 and pyrolysis furnace 11. The cabinet 61 has a moveable side panel 65 at one end of the apparatus 1 to allow loading of solid coating material into the vaporizer 7. The apparatus 1 also has a first lower cabinet, generally designated 69, that encloses an electrical control panel 73 and computer 75 for controlling operation of the parylene depositing system 3. A second lower cabinet, generally designated 79, houses the vacuum pump 25 and a mechanical chiller, generally indicated 83, connected to the cold trap 21. As shown in FIG. 1, the first and second lower cabinets 69, 79 are both accessible from the service side 41 of the apparatus 1 and have removable panels 87 that can be removed (FIGS. 5 and 6) to allow maintenance to be performed on the electrical control panel 73, vacuum pump 25, and mechanical chiller 83 housed therein. The second lower cabinet 79 has a countertop 91 on which the deposition enclosure 15 is mounted. The cold trap 21 extends upward through the countertop 91 adjacent the deposition enclosure 15. In one particular embodiment, the apparatus 1 includes a shroud 97 enclosing the cleanroom side of the deposition enclosure 15 to allow access to the enclosure from inside the cleanroom 29. The shroud 97 is mounted on the countertop 91 and isolates the cold trap 21 and the other equipment of the apparatus 1 from the cleanroom 29 so that particulates or other contaminates generated from these components do not enter the cleanroom.

Figure 5:
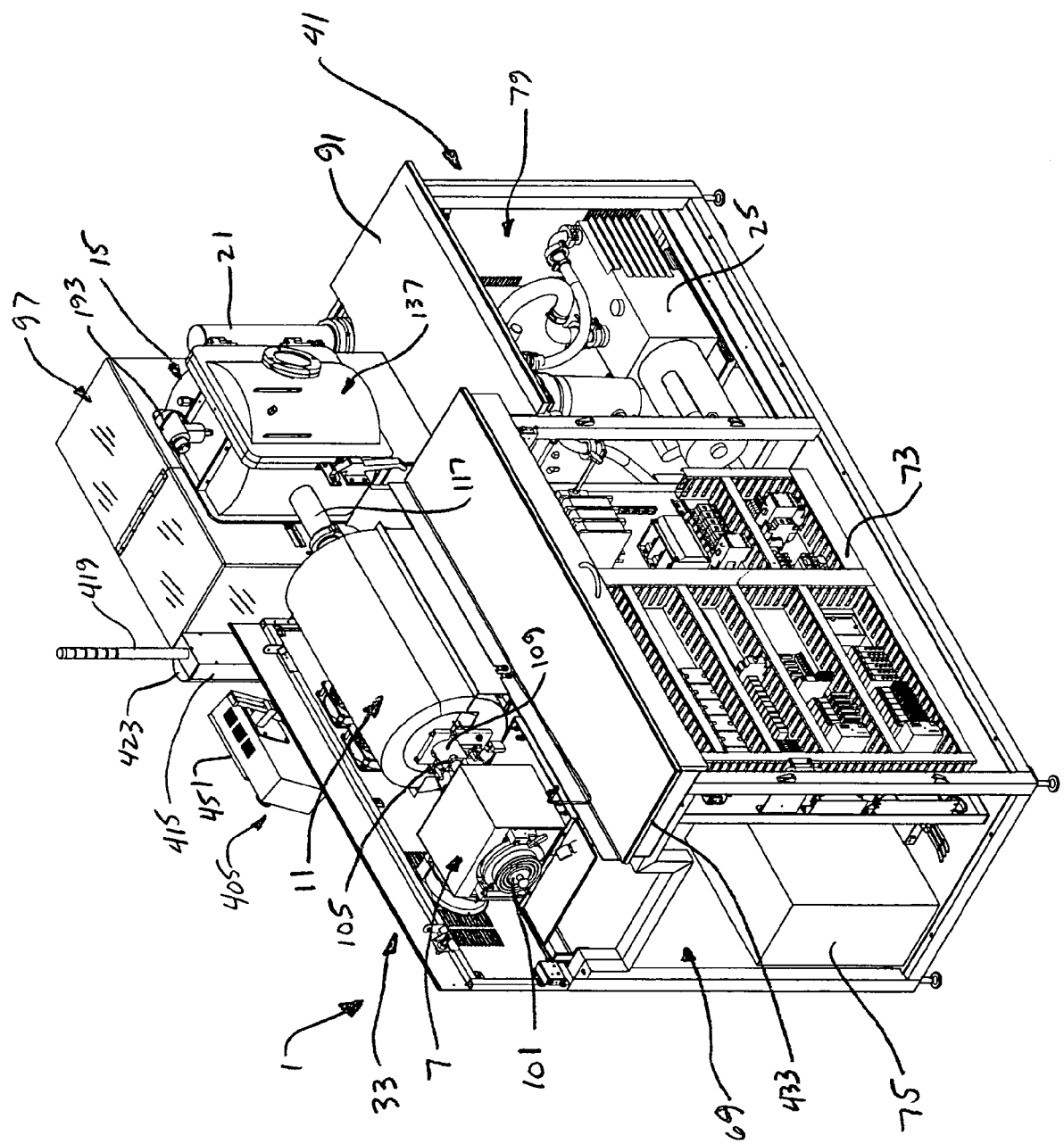
FIG. 5 is a front perspective of the vapor deposition apparatus with panels of an upper cabinet and lower cabinets removed to show details.
Figure 6:
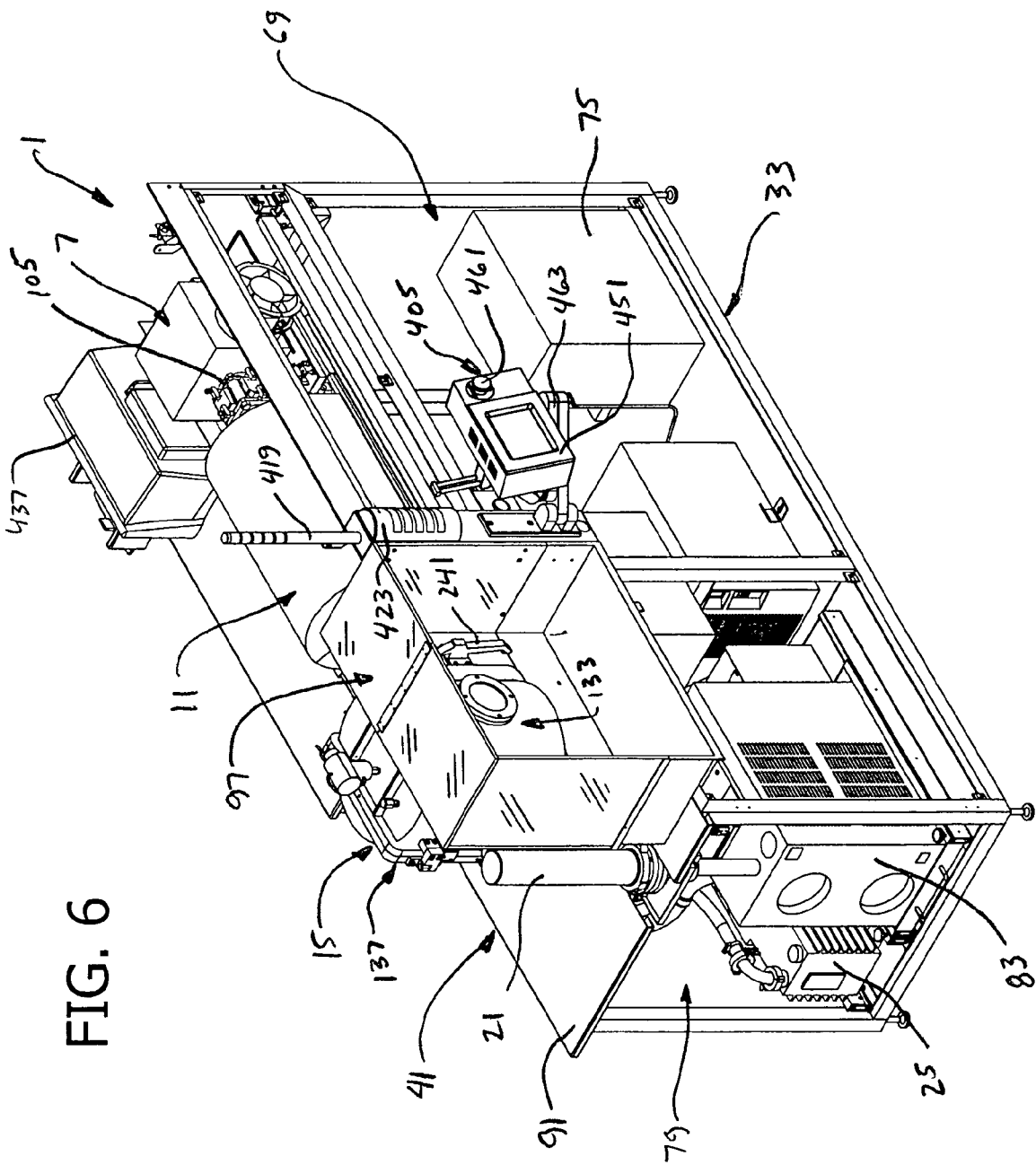
FIG. 6 is a rear perspective of the vapor deposition apparatus with panels of the upper cabinet and lower cabinets removed to show details.

As best shown in FIGS. 4–6, the vaporizer 7 has an access door 101 that allows the placement of solid coating material (e.g., granular parylene dimer) into the parylene deposition system 3. The vaporizer 7 heats the solid parylene dimer to a temperature above the sublimation point of the dimer (e.g., about 90° C.) so that the solid dimer slowly vaporizes, passing directly from a solid to a gas. In one particular embodiment, a vaporizer valve 105 is located in a connecting pipe 109 that interconnects the vaporizer 7 and the pyrolysis furnace 11. In the open position of the valve 105, gaseous dimer is allowed to exit the vaporizer 7 and flow into the pyrolysis furnace 11. In the closed position, the vaporizer valve 105 isolates the vaporizer 7 from the furnace 11 preventing backflow of gas from the furnace into the vaporizer.

The pyrolysis furnace 11 receives the gaseous dimer that passes through the vaporizer valve 105 and further heats the dimer gas to a suitable temperature (e.g., approximately 700° C.) sufficient to cause a chemical reaction that cleaves each molecule of the dimer gas to create a pyrolized gas comprising monomer molecules. The pyrolysis furnace 11 has an outlet 113 that is connected to an inlet 117 of the deposition enclosure 15 allowing the pyrolized monomer gas to flow into the deposition chamber 17. The pyrolized gaseous coating material will exit the furnace 11 and enter the deposition enclosure 15 once the pressure in the furnace builds to a sufficient level due to the heating and chemical reaction of the gaseous dimer.

As best seen in FIGS. 7–10, the deposition enclosure 15 encloses the deposition chamber 17 wherein items 125 (FIG. 10) to be coated are housed during the parylene deposition process. The deposition enclosure 15 comprises a generally rectangular structure, generally indicated 129 (hereinafter referred to as a "body"), an access door, generally indicated 133, located at the cleanroom side of the body, and a service door, generally indicated 137, located at the service side of the body. The body 129 has two curved sidewalls 141, a flat top wall 145, a flat bottom wall 149, a front flange 153 that frames a front rectangular opening 157 of the body and a rear flange 161 that frames a rear rectangular opening 165 of the body. It will be understood that other configurations of the body 129 are possible without departing from the scope of this invention. In one embodiment, the inlet 117 of the deposition enclosure 15 comprises an inlet pipe (also designated 117) which extends from an opening 169 in one of the sidewalls 141 of the body 129 and is connected to the outlet 113 (FIG. 4) of the pyrolysis furnace 11. The body 129 has an outlet 173 that extends from an opening 177 in the other sidewall 141 of the body and is connected to a pipe reducer 181 (FIG. 4) connected to an inlet 185 of the cold trap. The inlet 117 of the deposition enclosure 15 allows gaseous coating material to flow from the pyrolysis furnace 11 into the deposition chamber 17 and the outlet 173 allows any excess gaseous coating material that is not condensed in the chamber to exit the enclosure and enter the cold trap 21. The body 129 has a fitting 189 in its top wall 145 for connection to a pressure sensor 193 (FIG. 5) that is enclosed in a sensor housing 197 (FIG. 2) mounted on top of the deposition enclosure 115. The sensor housing 197 protects the pressure sensor 193 and covers the insulation and wiring of the sensor to provide a more finished look to the apparatus 1.

Figure 8:
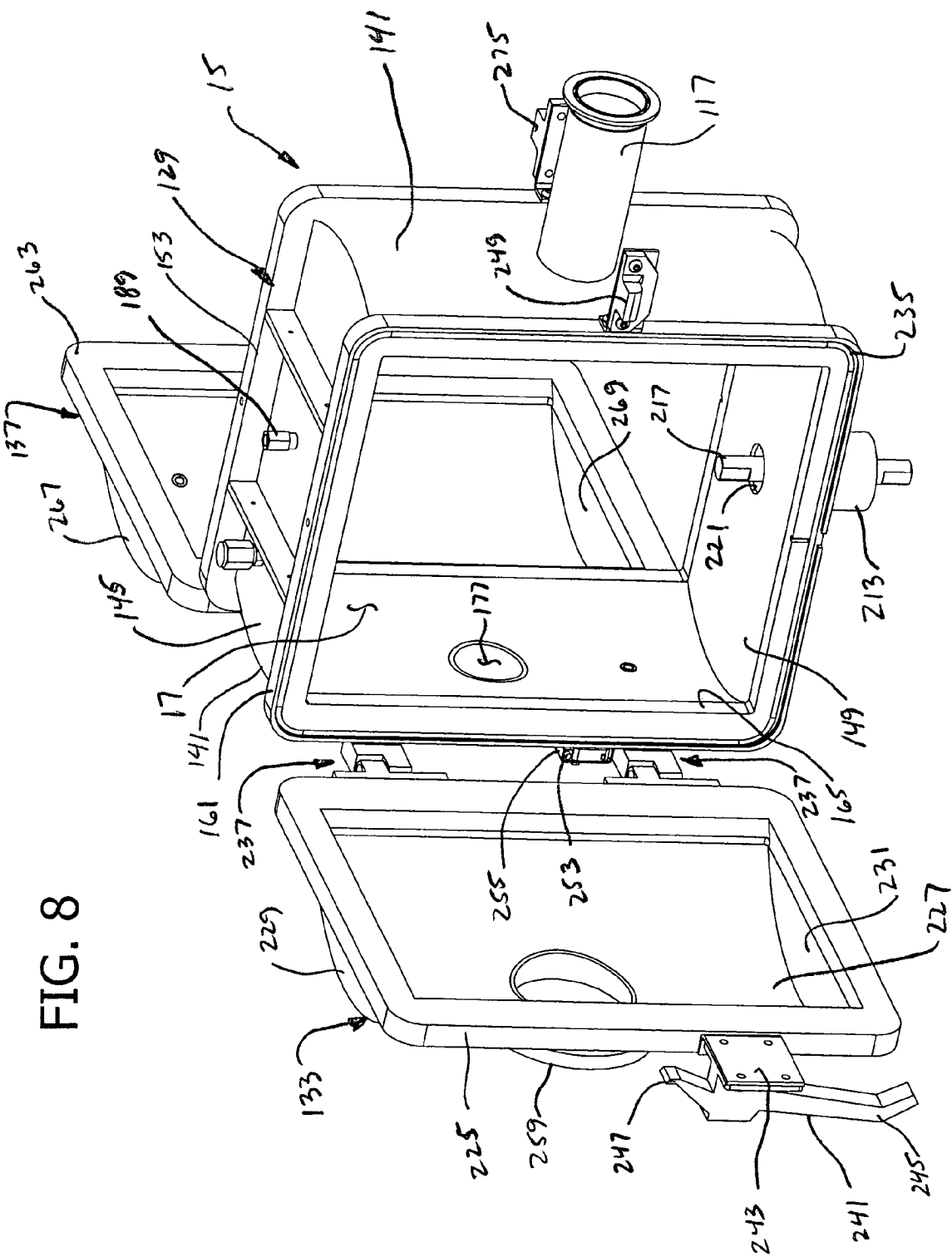
FIG. 8 is a back perspective of the vapor deposition enclosure with an access door and service door opened to show internal details.
Figure 10:
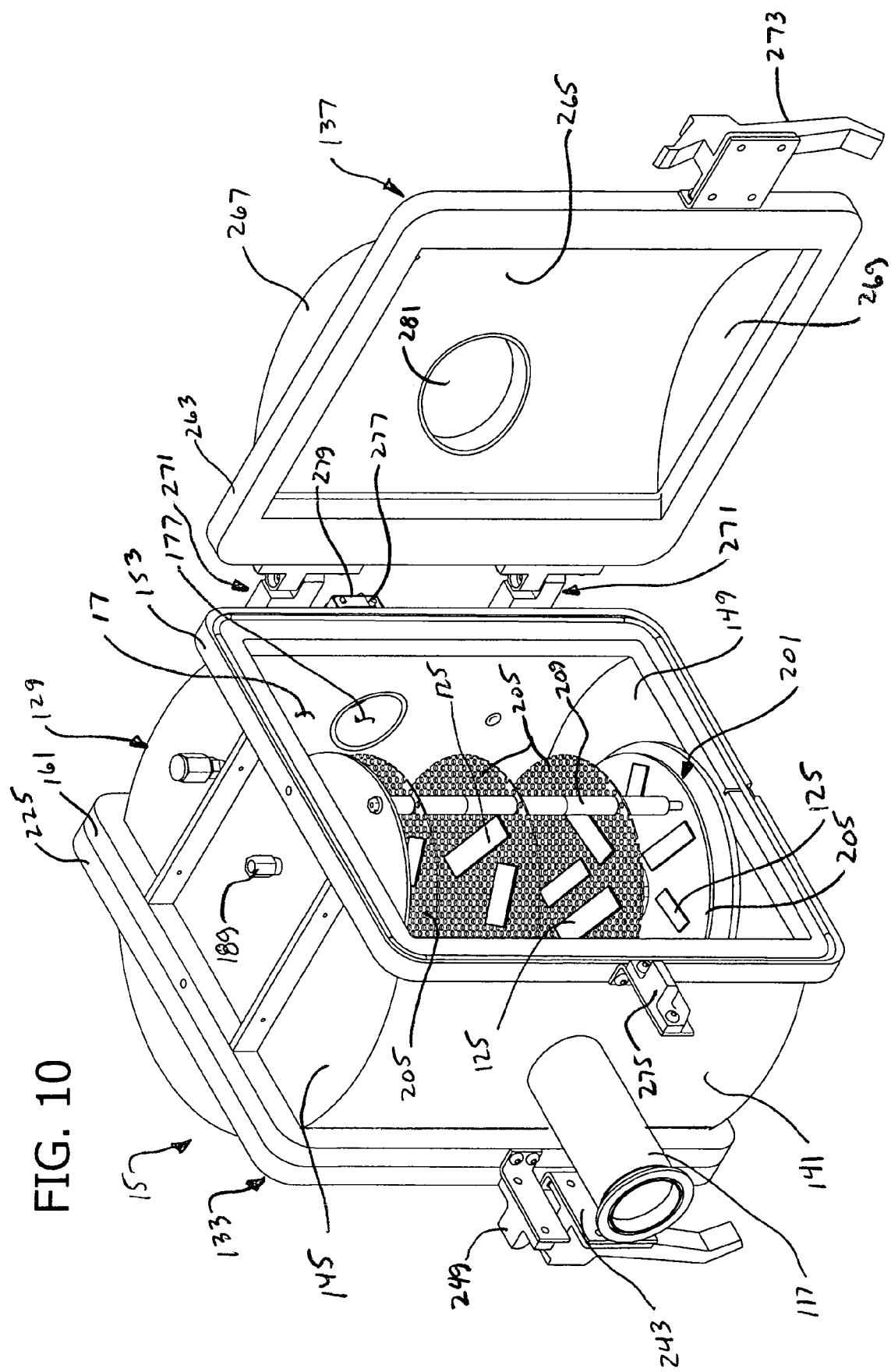
FIG. 10 is a front perspective of the vapor deposition enclosure with the service door open to show a platform housed in the enclosure.

As shown in FIG. 10, a rotatable platform, generally indicated 201, is disposed in the deposition chamber 17 and is supported by the bottom wall 149 of the body 129 for holding items 125 to be coated in the deposition chamber. In one embodiment, the platform 201 comprises a plurality of (e.g., five) spaced apart circular shelves 205 interconnected by a pair of vertical rods 209 (one shown) so that the shelves rotate together. The three middle shelves 205 are perforated to allow gaseous coating material to freely migrate throughout the deposition chamber 17 and promote uniform coating of the items 125 therein. As shown in FIG. 8, an actuator 213 is provided for rotating the platform 201 and the items 125 to promote uniform coating of the items. The actuator 213 has a vertical shaft 217 that protrudes through an opening 221 in the bottom wall 149 of the body 129 and engages the bottom shelf 205 of the platform 201. The shaft 217 of the actuator 213 is driven by a motor (not shown) to rotate the platform 201 during operation of the apparatus 1. It will be understood that the platform 201 and actuator 213 may have other variations and configurations, and that the platform and/or actuator may be omitted from the deposition enclosure 15 without departing from the scope of this invention.

Figure 7:
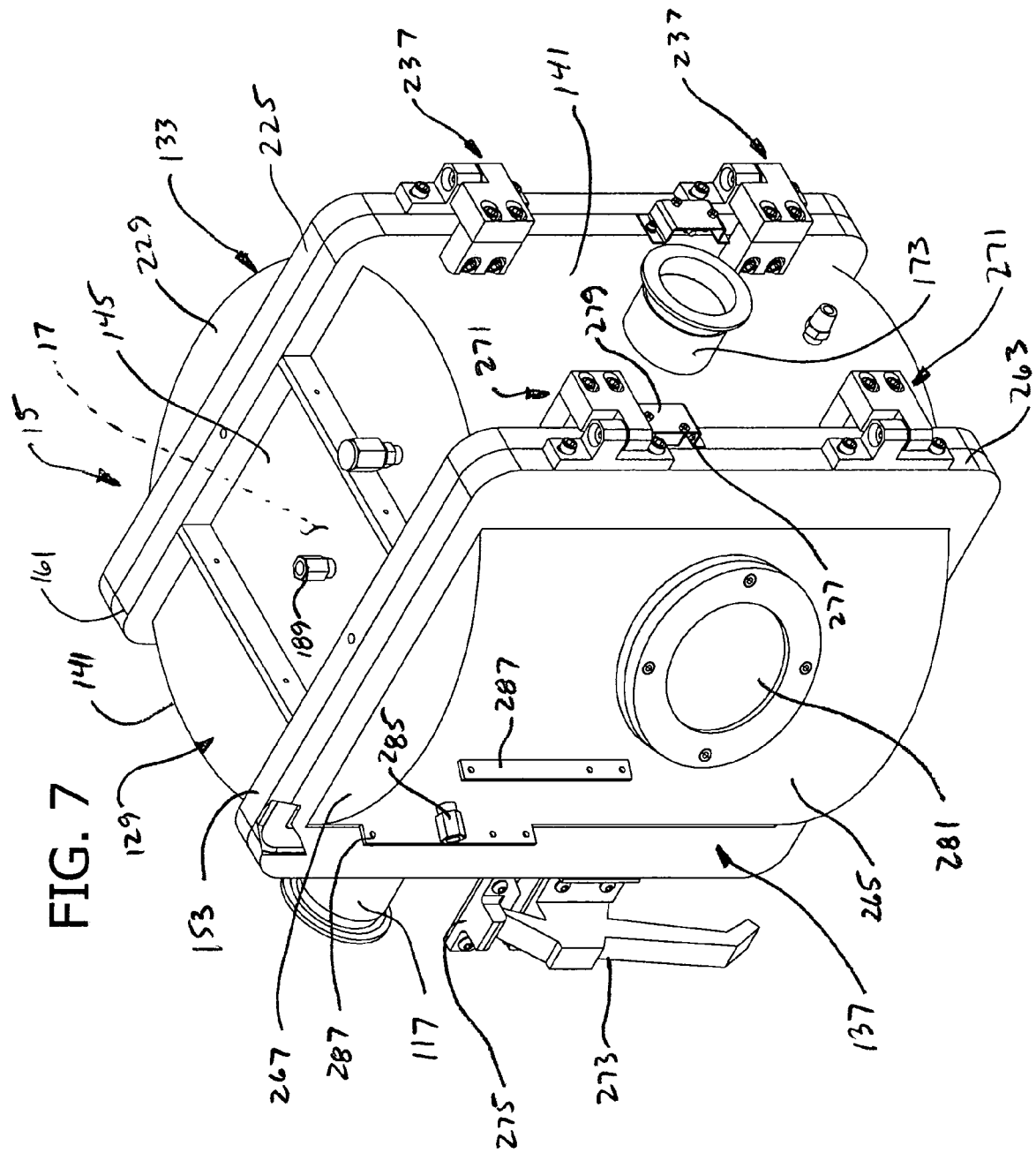
FIG. 7 is a front perspective of a vapor deposition enclosure removed from the vapor deposition apparatus.

As shown in FIGS. 7 and 8, the access door 133 is connected to the rear flange 161 of the body 129 on the cleanroom side 33 of the apparatus 1. The access door 133 has a flange 225 that is sized to correspond with the flange 161 framing the rear rectangular opening 165 of the body 129, a curved wall 227 that extends outward from the flange, and spaced apart top and bottom walls designated 229 and 231, respectively. In one embodiment, a resilient O-ring 235 is press fit into a groove (not shown) in the rear flange 161 of the body 129 to seal the access door 133 against the body of the enclosure 15 when the door is closed. Two hinge assemblies, generally designated 237 connect the access door 133 to the rear flange 161 of the body 129 to allow the access door to pivot between a closed position (FIG. 7) in which the door covers the rear opening 165 of the body and an open position (FIG. 8) allowing access to the deposition chamber 17 through the rear opening. A latch handle 241 is attached to a bracket 243 mounted on the access door flange 225 opposite the hinge assemblies 237. The handle 241 has a lower portion 245 for grasping by an operator and an upper latching portion 247 that engages a keeper 249 mounted on the rear flange 161 of the body 129 to secure the access door 133 in the closed position. A limit switch 253 is mounted on the rear flange 161 of the body 129 by a bracket 255 positioned between the two hinge assemblies 237. The limit switch 253 is positioned to provide an electrical signal that indicates the access door 133 is fully closed. The access door 133 has a circular window 259 located approximately on the horizontal and vertical centerlines of the door. The window 259 allows viewing of the items 125 in the deposition chamber 17 from the cleanroom side 33 of the apparatus 1 when the access door 133 is closed.

Figure 9:
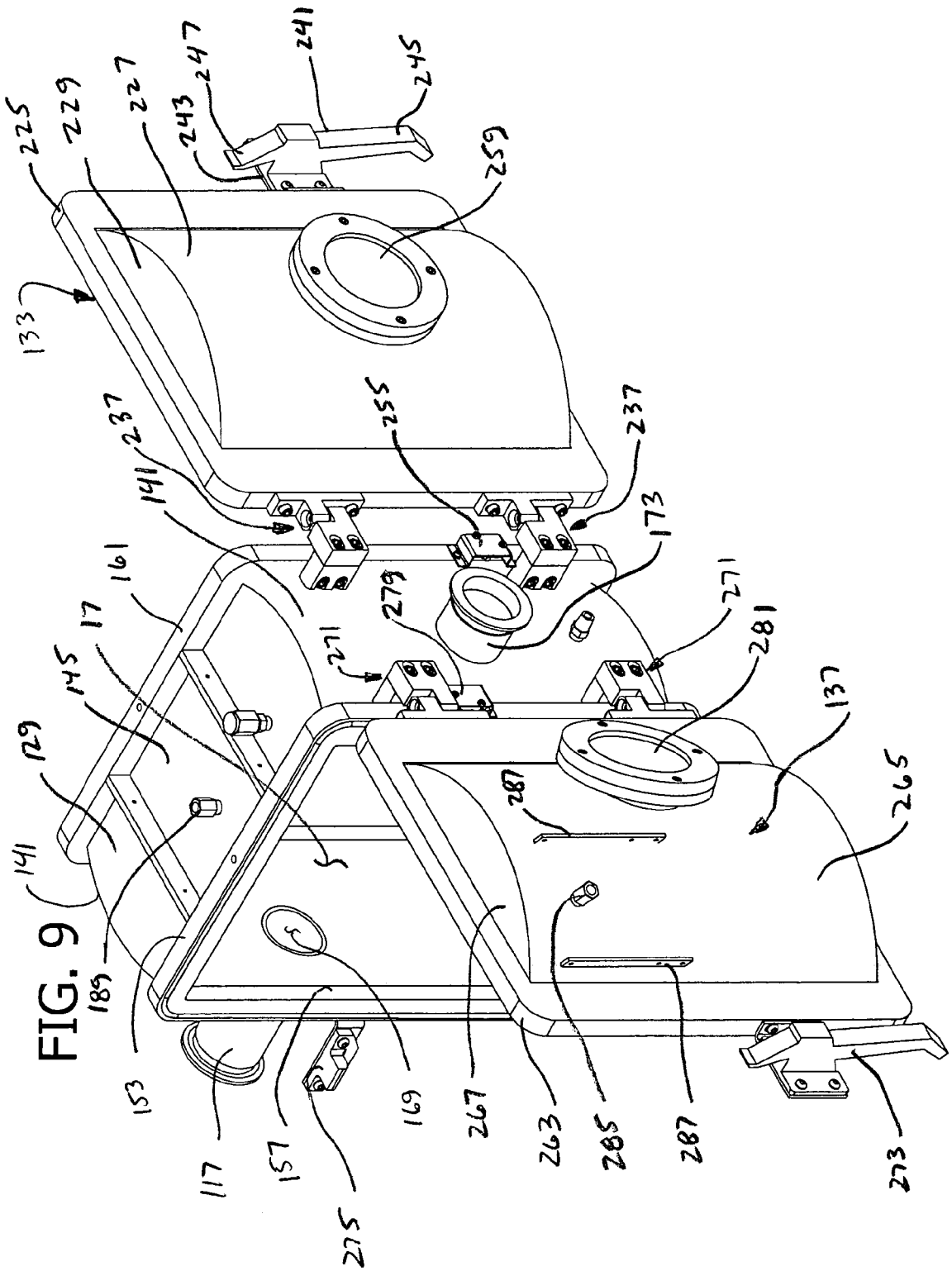
FIG. 9 is a side perspective of the vapor deposition enclosure with the access door and service door opened to show internal details.

As shown in FIGS. 7–9, the service door 137 is connected to the body 129 of the deposition enclosure 15 on the service side 41 of the apparatus 1. The service door 137 is constructed similar to the access door 133 and has a flange 263 sized to mate with the front flange 153 of the body 129. In the illustrated embodiment, the service door 137 is shaped similar to the access door 133 with a curved wall 265 extending outward from the door flange 263 and spaced apart top and bottom walls designated 267 and 269, respectively. The service door 137 is connected to the body 129 by two hinge assemblies 271 that allow the service door to pivot between a closed position (FIG. 7) covering the front opening 157 of the body 129 and open position (FIG. 8) allowing access to the deposition chamber 17. A latch handle 273 similar to the handle 241 on the access door 133 is mounted to the flange 263 of the service door 137 and engages a keeper 275 mounted on the front flange 153 of the body 129 to secure the service door in its closed position. A limit switch 277 is mounted on the service door 137 by a bracket 279 positioned between the hinge assemblies 271 to provide an electrical signal indicating the service door is closed. The service door 137 has a window 281 in the curved wall 265 of the door that is slightly offset from the horizontal centerline of the door to allow viewing of the deposition chamber 17 from the service side 41 of the apparatus 1 when the door is closed. The curved wall 265 of the service door 137 has a fitting 285 and two brackets 287 mounted on the door to allow the deposition enclosure 17 to be connected to an adhesion promotion system (not shown). The adhesion promotion system may optionally be provided to coat the items 125 in the chamber 17 with an adhesion promotion agent (e.g., silane) prior to coating the items with parylene.

Figure 4A:
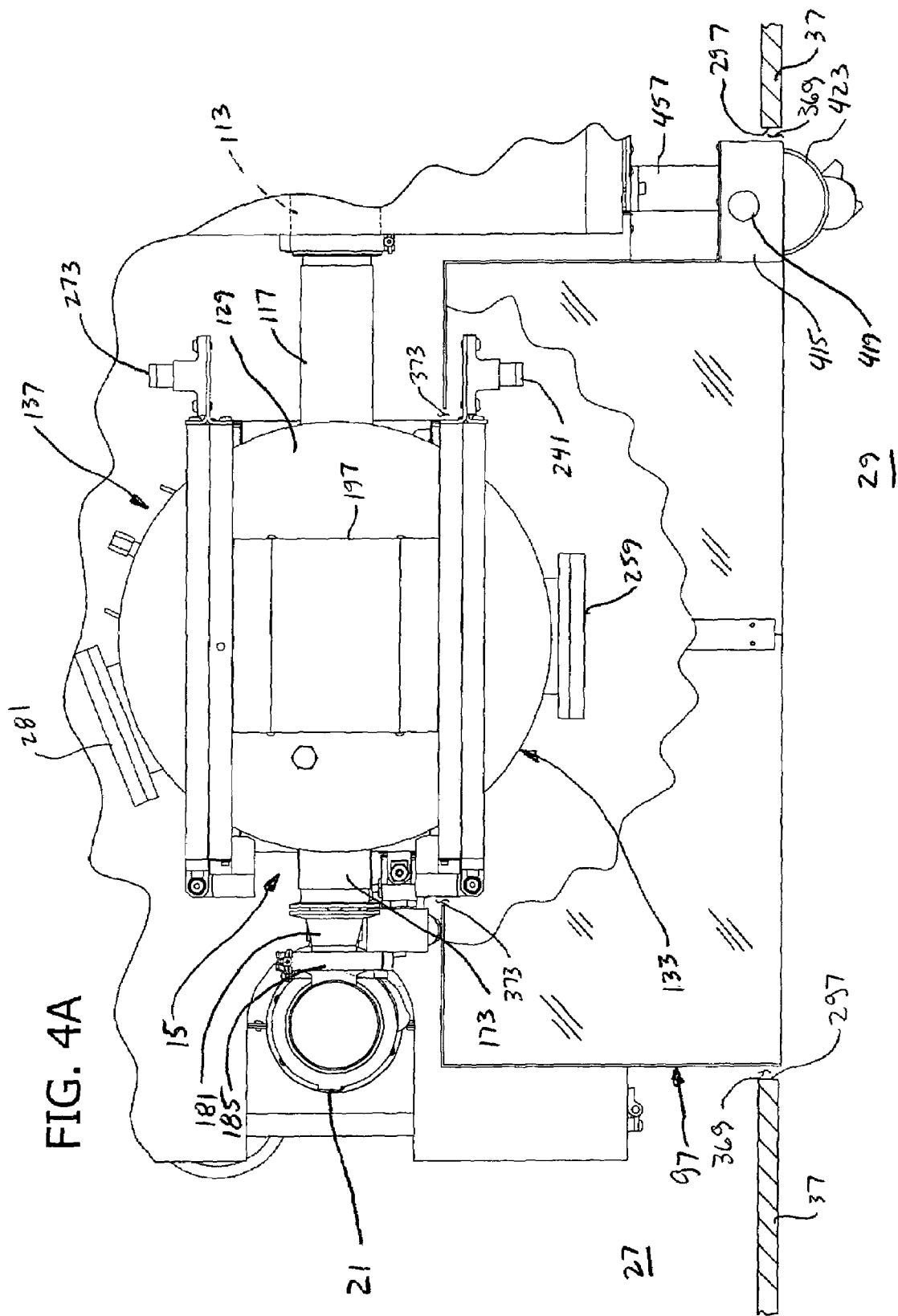
FIG. 4A is an enlarged portion of FIG. 4.

The deposition enclosure 15 is at least partially enclosed by the shroud 97 that is mounted on the countertop 91 of the second lower cabinet 79 of the vapor deposition apparatus 1. As shown in FIGS. 4 and 4A, the shroud 97 is positioned in an adjacent opening 297 in the cleanroom wall 37 to allow access to the deposition enclosure 15 from within the cleanroom 29. In the illustrated embodiment, the shroud 97 is positioned to isolate the service side 41 of the apparatus 1 so that airborne contaminates generated on the service side of the apparatus do not enter the cleanroom 29. In this way, the shroud 97 allows isolated access to the access door 133 on the deposition enclosure 15 from within the cleanroom 29.

In one embodiment (FIGS. 11–13), the shroud 97 comprises first and second upper parts, generally designated 305 and 307, respectively, and a lower part, generally designated 311. In the illustrated embodiment, the upper parts 305, 307 of the shroud 97 are made of a suitable transparent material (e.g., LEXAN® polycarbonate or other suitable plastic) to allow viewing of the vapor deposition apparatus 1 from within the cleanroom 29. Each upper part 305, 307 has a top wall 317, 319, a side wall 321, 323, and a back wall 325, 327, of solid transparent material that are joined together by suitable adhesive. The top walls 317, 319 of the upper parts 305, 307 butt against each other and are connected by a bracket 329 and threaded fasteners 331 (e.g., screws). The back walls 325, 327 of the upper parts 305, 307 cooperate to form an opening 335 for receiving the deposition enclosure 15. As shown in FIGS. 12 and 13, the back wall 325 of the first upper part 305 has two cutouts 337 shaped to receive the two hinge assemblies 237 that connect the access door 133 to the body 129 of the deposition enclosure 15 and a notch 341 shaped to fit around the limit switch bracket 255 attached to the rear flange 161 of the body. The back wall 327 of the second upper part 307 has a notch 343 that fits around the keeper 249 attached to the rear flange 161 of the body 129. The cutouts 337 and notch 341 in the back wall 325 of the first upper part 305 and the notch 343 in the back wall 327 of the second upper part 307 allow the shroud 97 to fit in close proximity to the rear flange 161 of the deposition enclosure body 129.

Figure 11:
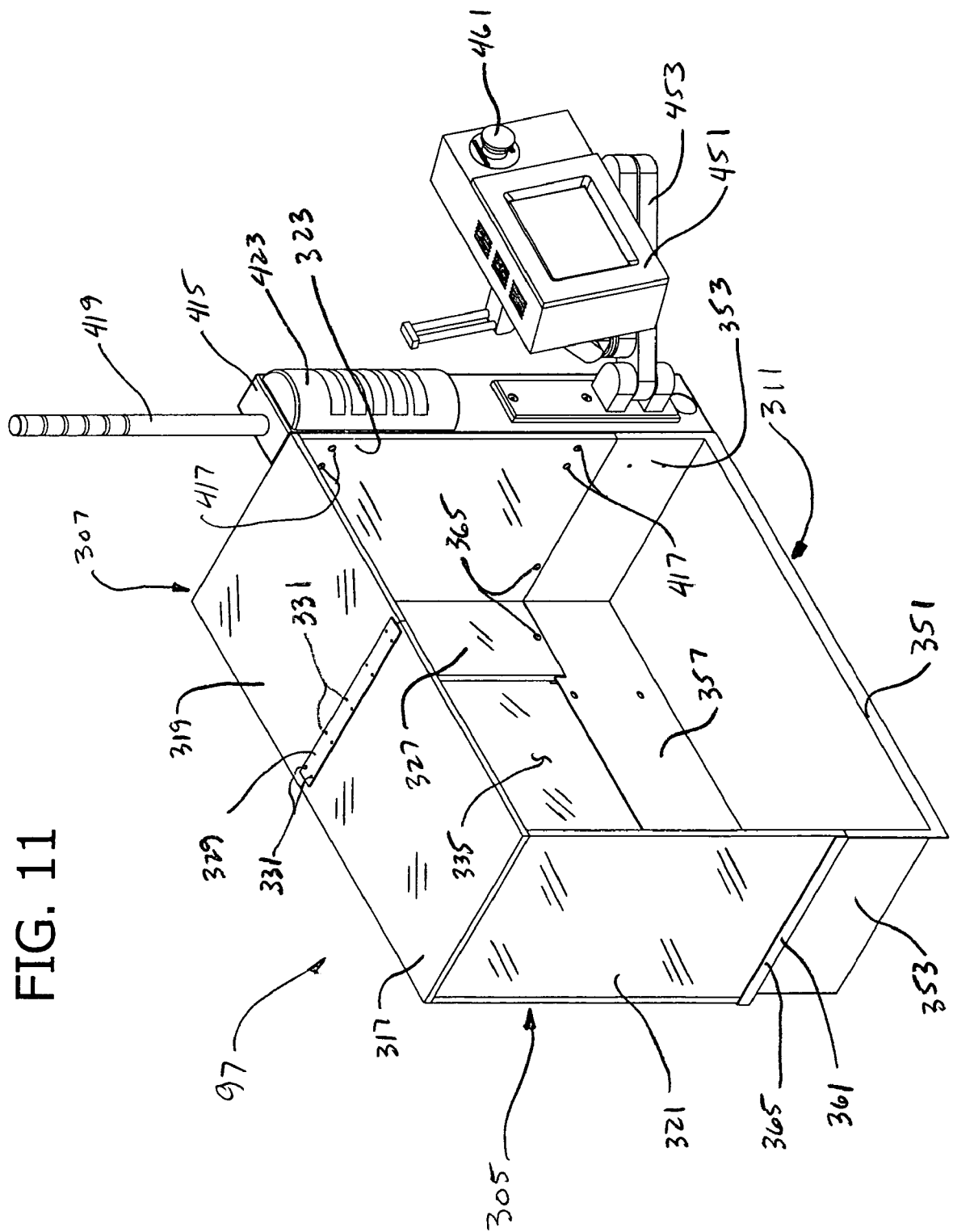
FIG. 11 is a front perspective of the shroud removed from the vapor deposition apparatus.
Figure 11A:
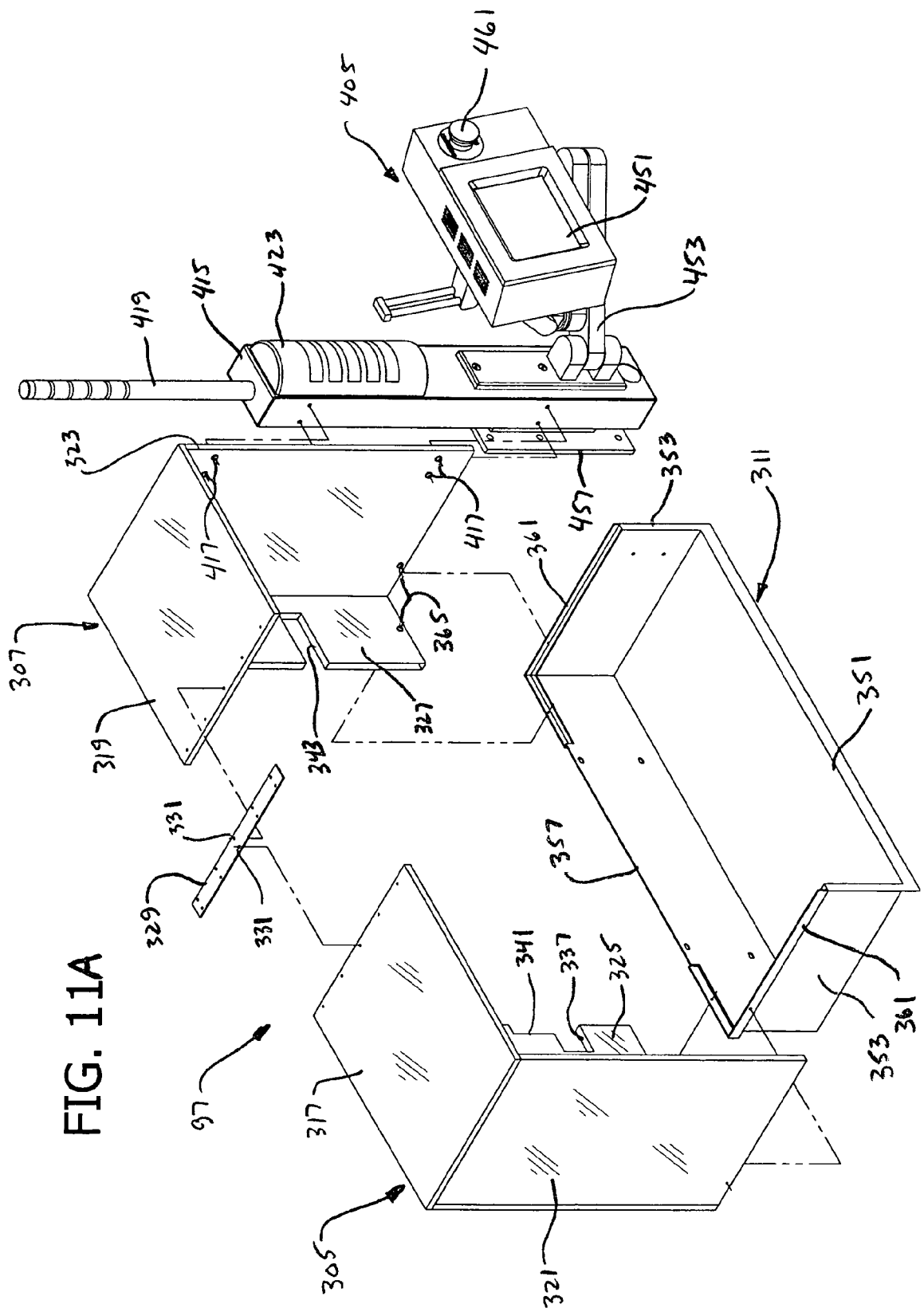
FIG. 11A is an exploded perspective of the shroud removed from the vapor deposition apparatus.
Figure 12:
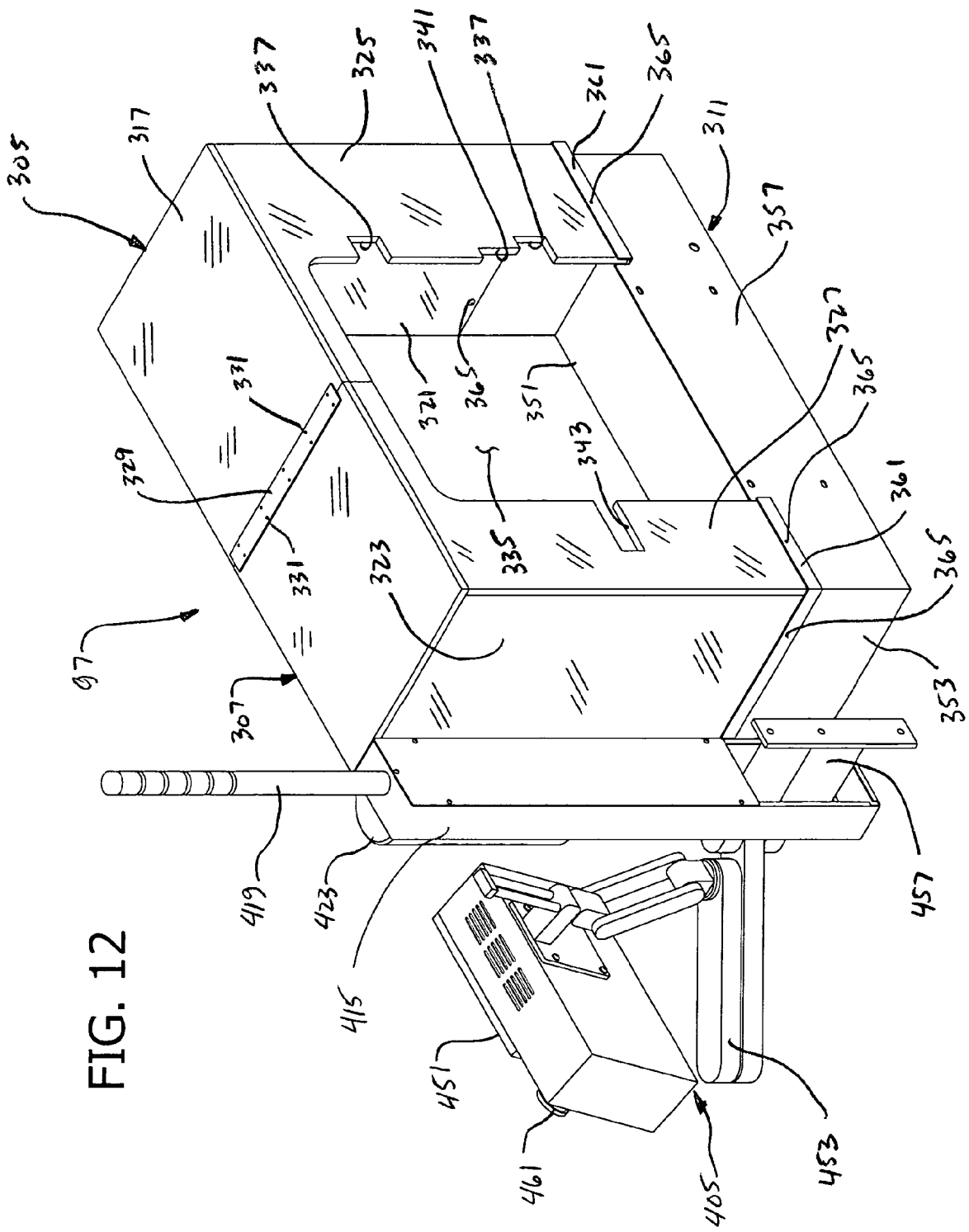
FIG. 12 is a back perspective of the shroud removed from the vapor deposition apparatus.
Figure 13:
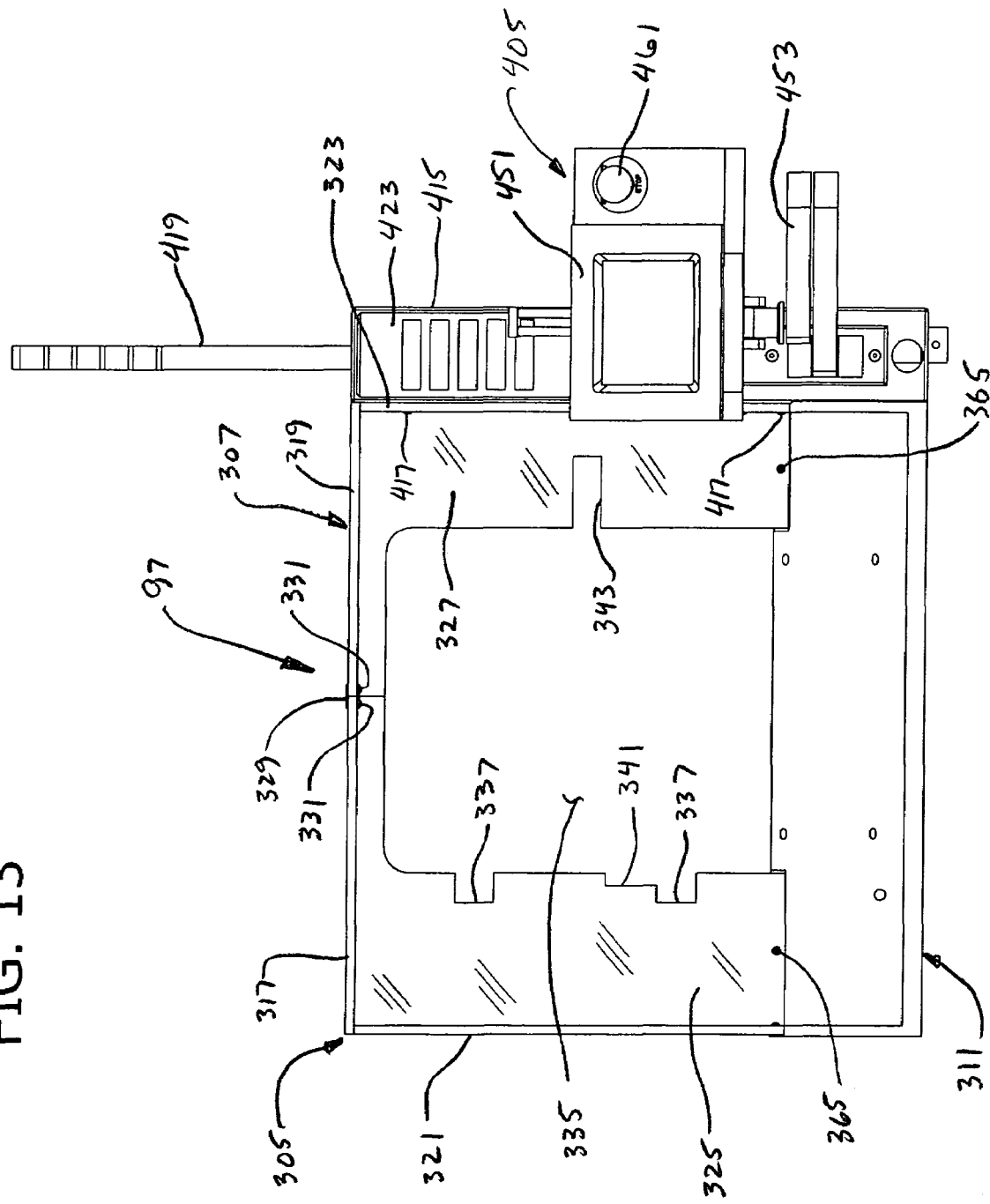
FIG. 13 is front elevation of the shroud removed from the vapor deposition apparatus.

As shown in FIGS. 11–13, the lower part 311 of the shroud 97 has a bottom wall 351, two side walls 353, and a back wall 357. The side walls 353 and back wall 357 of the lower part 311 mate with the corresponding side walls 321, 323 and back walls 325, 327 of the upper parts 305, 307 to form the shroud 97. The bottom wall 351 of the lower part 311 provides a platform to support items 125 that are being prepared for placement in the deposition enclosure 15 and items that have been removed from the deposition enclosure. In the illustrated embodiment, fastening flanges 361 project upwards from the top edges of the side walls 353 and portions of the back walls 357 of the lower part 311. These flanges 361 are offset laterally outward from respective inner surfaces of the lower part 311 of the shroud 97. When the upper parts 305, 307 and lower part 311 of the shroud 97 are assembled, as shown in FIG. 12, flanges 361 extend up on the outside of respective exterior surfaces of the upper parts 305, 307. Fasteners 365 extend through the upper parts 305, 307 of the shroud 97 into the flanges 361 to join the upper parts and the lower part 311 together. When the shroud 97 is assembled, the inside surface of the back walls 325, 327 and side walls 321, 323 of the upper parts 305, 307 are preferable generally coplanar with corresponding walls of the lower part 311. It will be understood that the shroud 97 may have other constructions. For example, the shroud 97 could be of one-piece without departing from the scope of this invention.

As best shown in FIGS. 4 and 4A, gaps 369 exist between the shroud 97 and the opening 297 in the wall 37 of the cleanroom 29 so that particulate is not generated by contact of the apparatus 1 with the cleanroom wall as the apparatus vibrates during operation. Also, gaps 373 exists between the shroud 97 and the deposition enclosure 15 of the apparatus 1 that simplify assembly of the apparatus by eliminating the need to assemble an airtight seal between the shroud and the enclosure. Typically, the cleanroom 29 will be maintained at a higher pressure due to the large volume of air being circulated and filtered to maintain the air quality of the cleanroom. The higher air pressure in the cleanroom 29 causes a constant airflow out of the cleanroom through the gap 373 between the shroud 97 and the deposition enclosure 15 and the gap 369 between the shroud and the cleanroom wall 29. This pressure differential and resulting airflow out of the cleanroom 29 prevents particulate from flowing into the cleanroom through the gaps 369, 373. Typically, these gaps will be approximately ⅛" and the cleanroom wall 37 will have a thickness of approximately ¼". Alternatively, a plastic or silicone sealant (e.g., RTV sealant or other non-fibrous sealant) may be used to seal the gaps 369, 373 to prevent the flow of air out of the cleanroom 29.

The access door 133 functions as the main loading door of the deposition enclosure 15 as items 125 to be coated by the apparatus 1 will be processed inside the cleanroom 29. The service door 137 of the deposition enclosure 15 allows access to the enclosure from the service side 41 of the apparatus 1 so that the enclosure can be routinely cleaned. In this regard, the deposition enclosure 15 must be cleaned periodically to remove parylene coating that deposits on the interior surfaces of the walls of the body 129, the access door 133, and the service door 137 of the enclosure. If an adhesion promotion agent is used, this material will also coat the inside of the deposition chamber 17 and must be removed periodically to clean the inside surfaces of the chamber. By accessing the enclosure 15 from the service door 137 and keeping the access door 133 closed, parylene coating and adhesion promotion agent can be removed from the deposition enclosure without contaminating the air quality within the cleanroom 29. Also, the cold trap 21 requires similar routine cleaning that can be accomplished by accessing the cold trap from the service side 41 of the apparatus 1. The shroud 97 isolates the cleanroom 29 from the service side 41 of the apparatus 1 and allows access to the deposition enclosure 15 from inside the cleanroom.

Figure 14:
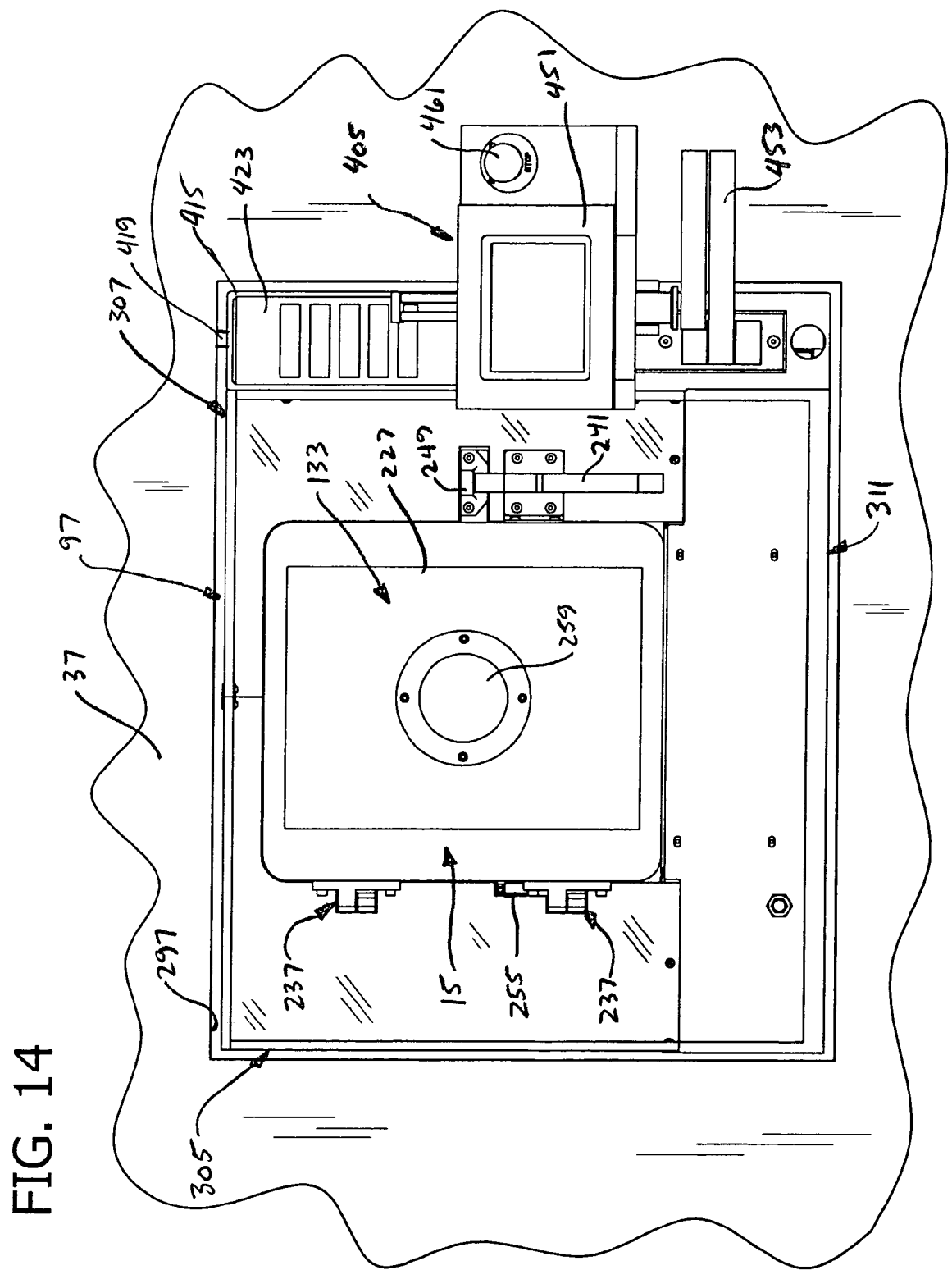
FIG. 14 is a partial elevation of the apparatus from within the cleanroom.

The vapor deposition apparatus 1 of the present invention has a control mechanism that monitors and controls the operation of the parylene deposition system 3. The control mechanism comprises a first control station, generally indicated 403, that is accessible from the service side 41 of the apparatus 1 and a second control station, generally indicated 405, that is accessible from the cleanroom side 33 of the apparatus. The control mechanism also includes the computer 75 and electrical control panel 73 housed in the first lower cabinet 69 of the vapor deposition apparatus 1 that communicate with both control stations 403, 405. The computer 75 runs a computer program that monitors the temperature and pressure at various points in the system 3 and operates the vapor deposition apparatus 1 according to various input parameters that are entered into the computer by the operator. As shown in FIGS. 11–13, an indicator housing 415 attached to one side of the shroud 97 via conventional fasteners 417 has a light tower 419 mounted on the top of the housing for providing status indication of the apparatus 1 that can be viewed from outside of the cleanroom 29. As shown in FIG. 14, a status indicator 423 is mounted inside the indicator housing 415 to provide status indication of the apparatus 1 that can be viewed from inside the cleanroom 29. The light tower 419 and status indicator 423 display the current status and any alarm conditions of the vapor deposition system 3.

The first control station 403 comprises a keyboard (not shown) housed in a drawer 433 mounted on top of the lower cabinet. As shown in FIGS. 1 and 2, a display screen 435 and a printer 437 are mounted on top of the keyboard drawer 433 for monitoring and control of the apparatus 1 from the service side 41 of the apparatus. The display screen 435 and keyboard allow an operator to monitor and control the temperature and pressure at various points throughout the vapor deposition apparatus 1. As shown in FIG. 4, an emergency stop button 441 is located on the side wall of the first lower cabinet 69 spaced above the countertop 91 of the second lower cabinet 79 to allow immediate shutdown of the apparatus 1 by the operator.

The second control station 405 includes a control screen 451 mounted on the indicator housing 415 to allow monitoring and control of the vapor deposition apparatus 1 from within the cleanroom 29. The control screen 451 is mounted on a swivel arm 453 connected to the indicator housing 415 to allow the screen to be pivoted with respect to the apparatus 1. As shown in FIGS. 4 and 4A, a bracket 457 extends from the arm 453 and is attached to the vapor deposition apparatus 1 to provide support for the swivel arm and control screen 451. The swivel arm 453 extends into the cleanroom 29 so that the control screen 451 is visible and accessible from inside the cleanroom 29 (see FIG. 14). In one embodiment, the control screen 451 is a touch screen allowing an operator to interface with the control mechanism of the apparatus 1. The status indicator 423 located in the indicator housing 415 mounted on the shroud 97 displays operational information of the apparatus to personnel inside the cleanroom 29. An emergency stop button 461 is mounted on the control screen 451 to allow the vapor deposition apparatus 1 to be immediately shut down by an operator inside the cleanroom 29.

The process for coating an item 125, or multiple items, with a coating of parylene involves the use of a vapor deposition apparatus such as the apparatus 1 described above. The process is initiated by positioning the apparatus 1 so that the shroud 97 is disposed in or adjacent the opening 297 in the cleanroom wall 37 to allow the access door 133 to be opened from inside the cleanroom 29. The item 125 to be coated is loaded into the apparatus 1 from inside the cleanroom 29 by opening the access door 133 of the deposition enclosure 15 and placing the item to be coated on the platform 201 located in the deposition chamber 17. In one embodiment, solid coating material is loaded into the apparatus 1 by lowering the moveable side panel 65 of the upper cabinet 61, opening the access door 101 of the vaporizer 7 and placing solid parylene dimer material in the vaporizer. The control mechanism is actuated by an operator to start the vacuum pump 25 and the heating of the solid parylene dimer in the vaporizer 7. After loading the solid parylene dimer into the vaporizer 7 and loading the item 125 to be coated in the apparatus 1, the control mechanism may be actuated from either the first local control station 403 from the service side 41 of the apparatus or the second local control station 405 from within the cleanroom 29. The solid parylene dimer is heated in the vaporizer 7 to a temperature above the sublimation point of the dimer (e.g., about 90° C.) so that the solid dimer slowly vaporizes passing directly from a solid to a gas. The dimer gas is conveyed under vacuum through the connecting pipe 109 and vaporizer valve 105 into the pyrolysis furnace 11. In the pyrolysis furnace 11, the dimer gas is heated to approximately 700° C., causing a chemical reaction that separates each molecule of the dimer gas into a pair of monomer molecules. The monomer gas flows through the inlet 117 of the deposition enclosure 15 that is maintained at approximately room temperature. The monomer molecules will condense and polymerize on all surfaces of the item 125 positioned on the platform 201 in the deposition chamber 17 to form a coating of parylene on the item having a uniform thickness. Once the coating process is complete, the control mechanism provides indication to the operator that the item 125 in the deposition chamber 15 is ready to be removed from the chamber 17. The item 125 is removed by opening the access door 133 by accessing the door through the shroud 97 and removing the item from the platform 201 and placing the item in the cleanroom 29 by removing the item through the shroud. The item 125 removed from the chamber 17 may be temporarily stored on the bottom wall 351 of the shroud 97 so that the deposition enclosure 15 may be reloaded with additional items to be coated.

Additionally, parylene will condense and form a coating on all ambient temperature surfaces within the deposition chamber 17 including the inner surfaces of the chamber body 129, access door 133 and service door 137. The parylene coating buildup on the inner surfaces of the deposition enclosure 17 must be periodically removed so that the performance of the apparatus 1 is not affected. Also, excess parylene monomer gas and adhesion promotion agent that does not condense on the item 125 or the surfaces in the deposition enclosure 15 will flow through the outlet 173 of the deposition enclosure and condense in the cold trap 21 of the apparatus 1. The cold trap 21 also must be periodically cleaned to remove the particulate buildup in the cold trap and maintain the filter efficiency of the cold trap. The cold trap 21 prevents parylene and other materials that exit the deposition chamber 17 from reaching the vacuum pump 25 located downstream of the cold trap.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained. For example, the access door 133 located at the cleanroom side 33 of the apparatus 1 allows the deposition enclosure 15 to be accessed and loaded from within the cleanroom 29. The service door 137 located at the service side 41 of the apparatus 1 allows the deposition enclosure 15 to be accessed from the service side for maintenance and cleaning of the apparatus 1. The shroud 97 located in or adjacent the opening 297 of the cleanroom wall 37 allows the vapor deposition apparatus 1 to be positioned outside of the cleanroom 29 while still allowing access to the deposition enclosure 17 of the apparatus from within the cleanroom. Locating the apparatus 1 outside of the cleanroom 29 allows maintenance and cleaning to be performed on the cold trap 21 and vacuum pump 25 from the service side 41 of the apparatus without contaminating the air quality of the cleanroom 29. The control mechanism of the apparatus having the first and second local control stations designated 403 and 405, respectively, allows the operation of the apparatus 1 to be monitored and controlled from both outside and inside the cleanroom 29.

As various changes could be made in the above constructions without departing from the scope of the invention, it is intended that all matter contained in the above description or shown in the accompanying drawings shall be interpreted as illustrative and not in a limiting sense. For example, the various components of the vapor deposition apparatus 1 including the vaporizer 7, pyrolysis furnace 11, deposition enclosure 15, cold trap 21 and vacuum pump 25 may be otherwise shaped and arranged without departing from the scope of this invention. Also, the deposition enclosure 15 may have other shapes and sizes and comprise other materials without departing from the scope of this invention. For example, the deposition enclosure 15 may be a cellular tumble coater as disclosed in U.S. Pat. Nos. 6,375,745 and 5,201,956, both of which are incorporated by reference herein for all purposes. Further, the shroud 97 may have other configurations and comprise other materials without departing from the scope of this invention. For example, the shroud 97 may be a tubular device or any other such enclosure that allows access to the deposition enclosure 15 from the cleanroom 29 and isolates the cleanroom from the service side 41 of the apparatus 1.

What is claimed is:

1. An apparatus for coating an item, said apparatus having a cleanroom side that is accessible from inside a cleanroom and a service side that is not accessible from inside the cleanroom, said apparatus comprising
   a vaporizer for vaporizing solid coating material,
   a pyrolysis furnace for heating the vaporized coating material to form a pyrolized gaseous coating material, and
   a deposition enclosure defining a deposition chamber for receiving an item to be coated, said deposition enclosure having an inlet for flow of pyrolized gaseous coating material from a source outside the deposition chamber into the deposition chamber, an outlet for flow of pyrolized gaseous coating material from the deposition chamber, an access door for accessing the deposition chamber from the cleanroom side of the apparatus, and a service door for accessing the deposition chamber from the service side of the apparatus,
   wherein said vaporizer, pyrolysis furnace, and service door are on the service side of the apparatus and wherein said apparatus is accessible through the access door from inside the cleanroom through an opening in a wall of the cleanroom,
   said apparatus further comprising a shroud distinct from said cleanroom wall at least partially surrounding the access door to isolate the access door from the service side of said apparatus and to allow isolated access to the access door and deposition chamber from inside the cleanroom.

2. The apparatus set forth in claim 1 further comprising a filter connected to said outlet for receiving gaseous coating material discharged from the deposition chamber, said filter being accessible from the service side of the apparatus.

3. The apparatus set forth in claim 1 wherein said shroud comprises a platform for supporting said items outside of the deposition enclosure.

4. The apparatus set forth in claim 1 further comprising a control mechanism comprising at least two local control stations for controlling operation of the apparatus.

5. The apparatus set forth in claim 4 wherein said at least two local control stations comprise a first local control station accessible from outside of the cleanroom and a second local control station accessible from within the cleanroom.

6. The apparatus set forth in claim 4 wherein said control mechanism comprises an indicator for displaying a status of the apparatus, said indicator being visible from inside the cleanroom.

7. A deposition enclosure for use in an apparatus having a cleanroom side and a service side, said deposition enclosure comprising
   a structure defining a deposition chamber for receiving an item to be coated,
   an inlet for flow of coating material from a source outside the deposition chamber into the deposition chamber,
   an outlet for flow of coating material out of the deposition chamber,
   at least two doors attached to said structure to allow access to said deposition chamber, at least one of said doors allowing access to the deposition chamber from the cleanroom side of the apparatus for placement of an item to be coated in the deposition chamber and for removal of a coated item from the deposition chamber, wherein said at least two doors comprise an access door and a service door, said access door being configured to allow access to the deposition chamber from inside a cleanroom and said service door being configured to allow access to the deposition chamber from outside the cleanroom
   wherein said apparatus is accessible through the access door from inside the cleanroom through an opening in a wall of the cleanroom,
   said enclosure further comprising a shroud distinct from said cleanroom wall at least partially surrounding said access door to isolate the access door from the service side of said apparatus and to allow isolated access to the access door and deposition chamber from inside the cleanroom.

8. The deposition enclosure set forth in claim 7 wherein said service door is connected to said structure on the service side of the apparatus.

9. The deposition enclosure set forth in claim 7 wherein said access door is connected to said structure on the cleanroom side of the apparatus.

10. The deposition enclosure set forth in claim 7 wherein said access door and said service door are attached to said structure by hinges.

11. The deposition enclosure set forth in claim 7 wherein said access door comprises a window for viewing the deposition chamber from inside the cleanroom.

12. The deposition enclosure set forth in claim 7 wherein said service door comprises a window for viewing the deposition chamber from outside the cleanroom.

13. An apparatus for coating an item, said apparatus being adapted to be positioned outside of a cleanroom and being accessible from inside the cleanroom through an opening in a cleanroom wall, said apparatus comprising
- a vaporizer for vaporizing solid coating material,
- a pyrolysis furnace for heating the vaporized coating material to form a pyrolized gaseous coating material,
- a deposition enclosure defining a deposition charter for receiving an item to be coated, said deposition enclosure having an inlet for flow of pyrolized gaseous coating material into the deposition chamber, an outlet for flow of pyrolized gaseous coating material from the deposition chamber, and at least two doors for accessing the deposition chamber, and
- a shroud distinct from said cleanroom wall at least partially surrounding one but not both of said at least two doors to allow isolated access to said one door and the deposition chamber from inside the cleanroom.

14. The apparatus set forth in claim 13 wherein said shroud is at least partially transparent to allow viewing of the apparatus from within the cleanroom.

15. The apparatus set forth in claim 13 wherein said shroud comprises a first upper part and a second upper part comprising a transparent material to allow viewing of the apparatus from within the cleanroom.

16. The apparatus set forth in claim 15 wherein said transparent material comprises polycarbonate.

17. The apparatus as set forth in claim 15 wherein said shroud comprises a lower part having a platform for supporting said items outside the deposition enclosure.

18. The apparatus set forth in claim 17 wherein said lower part comprises a fastening flange adapted for connection to said first and second upper parts.

19. The apparatus set forth in claim 13 wherein said shroud comprises a wall having an opening for receiving the deposition enclosure.

20. The apparatus set forth in claim 13 wherein said at least two doors comprise an access door and a service door, said access door being configured to allow access to the deposition chamber from inside the cleanroom and said service door being configured to allow access to the deposition chamber from outside of the cleanroom.

21. The deposition enclosure set forth in claim 7 wherein said shroud completely surrounds said access door.

22. The apparatus set forth in claim 13 wherein said shroud completely surrounds said access door.

23. The apparatus set forth in claim 1 wherein said solid coating material is a polymer, and wherein said deposition chamber is a chamber where said solid coating material polymerizes on said item to form a polymer coating.

24. The deposition enclosure set forth in claim 7 wherein said coating material is a polymer, and wherein said deposition chamber is a chamber where said coating material polymerizes on said item to form a polymer coating.

25. The apparatus set forth in claim 13 wherein said solid coating material is a polymer, and wherein said deposition chamber is a chamber where said solid coating material polymerizes on said item to form a polymer coating.

* * * * *